(12) United States Patent
Kim et al.

(10) Patent No.: US 9,379,264 B2
(45) Date of Patent: Jun. 28, 2016

(54) MULTILAYERED FILM AND PHOTOVOLTAIC MODULE INCLUDING THE SAME

(71) Applicant: LG CHEM, LTD., Seoul (KR)

(72) Inventors: Hyun Cheol Kim, Daejeon (KR); Yoon Kyung Kwon, Daejeon (KR); Hyun Seong Ko, Seoul (KR); Hyo Soon Park, Daejeon (KR); Do Won Ahn, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 13/891,057

(22) Filed: May 9, 2013

(65) Prior Publication Data

US 2013/0247984 A1 Sep. 26, 2013

Related U.S. Application Data

(63) Continuation of application No. PCT/KR2011/008462, filed on Nov. 8, 2011.

(30) Foreign Application Priority Data

Nov. 10, 2010 (KR) .................. 10-2010-0111751
Nov. 7, 2011 (KR) .................. 10-2011-0115306

(51) Int. Cl.
*H01L 31/048* (2014.01)
*C09D 133/04* (2006.01)
(Continued)

(52) U.S. Cl.
CPC ............. *H01L 31/0487* (2013.01); *C08J 7/047* (2013.01); *C08L 27/12* (2013.01); *C09D 127/16* (2013.01);
(Continued)

(58) Field of Classification Search
None
See application file for complete search history.

(56) References Cited

U.S. PATENT DOCUMENTS 5,180,634 A * 1/1993 Sempio et al. ............... 428/336
5,462,985 A 10/1995 Takei et al.
(Continued)

FOREIGN PATENT DOCUMENTS

CN 101681946 A 3/2010
CN 101868910 A 10/2010
(Continued)

OTHER PUBLICATIONS

Akasol "back-panel laminated films for solar engineering" Product Guide, Nov. 2005.*
(Continued)

*Primary Examiner* — Ling Choi
*Assistant Examiner* — Catherine S Branch
(74) *Attorney, Agent, or Firm* — Dentons US LLP

(57) ABSTRACT

A multilayered film, a back sheet for a photovoltaic cell, methods of manufacturing the film and cell, and a photovoltaic module including the film and cell are provided. The multilayered film includes a resin layer formed on a substrate, and the resin layer contains a fluorine-based polymer and a reactive functional group having an equivalent weight of 30,000 or less. The resin layer containing the fluorine-based polymer has good durability and weatherability and is highly adhesive to the substrate at an interface between the resin layer and the substrate. Also, since a drying process may be performed at a low temperature during manufacture of the multilayered film, manufacturing costs may be reduced, productivity may be increased, and degradation in the quality of products due to thermal deformation or thermal shock may be prevented. The multilayered film may be effectively used as, for example, a back sheet for various photovoltaic modules.

32 Claims, 1 Drawing Sheet

(51) Int. Cl.
*C08L 27/12* (2006.01)
*C08J 7/04* (2006.01)
*H01L 31/049* (2014.01)
*C09D 127/16* (2006.01)

(52) U.S. Cl.
CPC ............ *C09D 133/04* (2013.01); *H01L 31/049* (2014.12); *H01L 31/0481* (2013.01); *B32B 2457/12* (2013.01); *C08J 2427/12* (2013.01); *C08J 2433/04* (2013.01); *C08L 2203/204* (2013.01); *Y02E 10/50* (2013.01)

(56) References Cited

U.S. PATENT DOCUMENTS

| | | | |
|---|---|---|---|
| 5,534,384 A * | 7/1996 | Platzer et al. | 430/260 |
| 7,833,607 B2 | 11/2010 | Kawano et al. | |
| 2008/0070182 A1* | 3/2008 | Wyllie et al. | 433/8 |
| 2010/0175742 A1 | 7/2010 | Burchill et al. | |
| 2011/0046247 A1 | 2/2011 | Roelofs et al. | |
| 2011/0166293 A1* | 7/2011 | Dufaure | C08F 265/04 525/69 |
| 2011/0232735 A1 | 9/2011 | Bizet et al. | |
| 2011/0277834 A1* | 11/2011 | Hatakeyama | H01L 31/048 136/256 |
| 2012/0240986 A1 | 9/2012 | Debergalis et al. | |

FOREIGN PATENT DOCUMENTS

| | | |
|---|---|---|
| JP | 07-22637 A | 1/1995 |
| JP | 2002-036457 A | 2/2002 |
| JP | 2003-191403 A | 7/2003 |
| JP | 2008-28294 A | 2/2008 |
| JP | 4239823 B2 | 3/2009 |
| JP | 2009-522414 A | 6/2009 |
| JP | 201053014 A | 9/2010 |
| KR | 10-2008-0023641 A | 3/2008 |
| KR | 10-2010-0095622 A | 8/2010 |
| TW | 200936551 | 12/1997 |
| TW | 200918932 | 5/2009 |
| WO | 2007092663 A2 | 8/2007 |
| WO | 2008157159 A1 | 12/2008 |
| WO | 2010/101811 A1 | 9/2010 |
| WO | 2010/107282 A2 | 9/2010 |
| WO | 2011084438 A1 | 7/2011 |

OTHER PUBLICATIONS

D.A. Dillard and A.V. Pocius, The Mechanics of Adhesion, "Acrylic PSAs," pp. 485, 491 (2002).*
Mekhilef et al., "Effect of electron beam radiation on the melt rheology of polyvinylidene fluoride and its copolymers," ANTEC 2007, pp. 1695-1700.*
Kynar & Kynar Flex PVDF Performance Characteristics & Data (2009).*
"Functional Group Equivalent Weight," NICNAS Handbook, National Industrial Chemicals Notification and Assessment Scheme, Australia (2014).*
Palit, "Average Molecular Weights of High Polymers," J. Chem. Educ., pp. 199-200 (1947).*
Paraloid AU-1033, Technical Data Sheet [online], DOW, <URL: http://www.dow.com/assets/attachments/business/pmc/paraloid_au-1033/tds/paraloid_au-1033.pdf>.

* cited by examiner

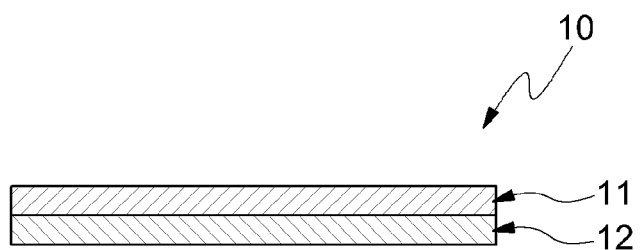

MULTILAYERED FILM AND PHOTOVOLTAIC MODULE INCLUDING THE SAME

This application is a Continuation Bypass of International Application No. PCT/KR2011/008462, filed Nov. 8, 2011, and claims the benefit of Korean Application Nos. 10-2010-0111751 filed on Nov. 10, 2010 and 10-2011-0115306 filed on Nov. 7, 2011 all of which are hereby incorporated by reference in their entirety for all purposes as if fully set forth herein.

BACKGROUND

1. Field of the Invention

The present application relates to a multilayered film, a back sheet for a photovoltaic cell, methods of manufacturing the film and the back sheet, and a photovoltaic module including the film and the back sheet.

2. Discussion of Related Art

In recent years, there has been a growing interest in renewable energy and clean energy due to the earth's environmental problems and exhaustion of fossil fuels. Among these, solar light energy has attracted much attention as a representative pollution-free energy source that may solve issues in environmental pollution and exhaustion of fossil fuels.

A photovoltaic cell is a device configured to convert solar light into electric energy based on the principle of generation of electricity using solar light. Since the photovoltaic cell should be exposed to the outside for a long period of time to facilitate absorption of solar light, a unit, called a photovoltaic module, may be manufactured using various packaging processes for protecting the photovoltaic cell.

In general, a photovoltaic module may be manufactured using a back sheet having good weatherability and durability so that photovoltaic cells can be stably protected even if exposed to the outside for a long period of time. The back sheet may include a resin layer stacked on a substrate, and the resin layer may include a fluorine-based polymer, such as poly(vinyl fluoride) (PVF).

However, since the PVF resin is poorly adhesive to a polyethylene terephthalate (PET) film typically used as a substrate of a back sheet, an fluorine-based polymer film may be obtained using an extrusion or casting process and then laminated on the substrate using a urethane-based adhesive. In this case, however, high-priced film manufacturing equipment may be required, the use of an adhesive may be needed, and an adhesive coating process and a lamination process may be further performed. Furthermore, a film having a greater thickness than a required thickness may be adopted for convenience in handling the film during a film manufacturing process, the use of various additives and fillers may be limited, and a high process temperature may be required.

In another case, even if an fluorine-based polymer film is manufactured using a resin suspension or solution, coated on a substrate, and dried, since a solvent having a high boiling point is typically used, a high drying temperature of approximately 200° C. or higher may be required.

Since a PVF resin solution requiring a high drying temperature consumes a large amount of energy to provide a high drying temperature, the cost of manufacturing of a back sheet of a photovoltaic module may increase, thermal shock or thermal deformation may be caused to deteriorate the quality of products, such as mechanical properties of the products, and long-term use of the products outdoors may lead to rapid degradation in the mechanical properties of the products.

Therefore, there are ongoing demands for materials for a back sheet for a photovoltaic cell, which has good durability and weatherability, can be dried at a low temperature to reduce the cost of manufacturing of the back sheet for the photovoltaic cell, and can improve the productivity and quality of the photovoltaic cell.

SUMMARY OF THE INVENTION

The present application is directed to providing a multilayered film.

Also, the present application is directed to providing a method of manufacturing the multilayered film.

Furthermore, the present application is directed to providing a back sheet for a photovoltaic cell and a photovoltaic module including the multilayered film.

One aspect of the present application provides a multilayered film including a substrate and a resin layer disposed on the substrate and including a fluorine-based polymer and an acrylic polymer containing a reactive functional group. An equivalent weight of the reactive functional group with respect to the entire polymer of the resin layer is 30,000 or less.

Another aspect of the present application provides a method of manufacturing a multilayered film, including forming a resin layer including an fluorine-based polymer and an acrylic polymer containing a reactive functional group on a substrate.

Still another aspect of the present application provides a back sheet for a photovoltaic cell, which includes the multilayered film, and a photovoltaic module including the back sheet for the photovoltaic cell.

BRIEF DESCRIPTION OF THE DRAWINGS

The above and other objects, features and advantages of the present application will become more apparent to those of ordinary skill in the art by describing in detail exemplary embodiments thereof with reference to the attached drawings, in which:

FIG. 1 is a schematic cross-sectional view of a multilayered film according to an exemplary embodiment of the present application.

DETAILED DESCRIPTION OF EXEMPLARY EMBODIMENTS

Hereinafter, exemplary embodiments of the present application will be described in further detail with reference to the accompanying drawings. Also, detailed descriptions of well-known functions and constructions are omitted for clarity and conciseness. In the drawings, irrelevant descriptions are omitted in order to clearly describe the present application, and the thicknesses of layers and regions may be exaggerated for clarity. The scope of the present application is not limited by thicknesses, sizes, and ratios indicated in the drawings.

FIG. 1 is a schematic cross-sectional view of a multilayered film 10 according to an exemplary embodiment of the present application. Referring to FIG. 1, the multilayered film 10 according to an exemplary embodiment of the present application may include a substrate 12 and a resin layer 11 formed on the substrate 12 and including a fluorine-based polymer and an acrylic polymer containing a reactive functional group.

The substrate 12 included in the multilayered film 10 according to the present application is not specifically limited to specific kinds, and various materials known in the art may be appropriately selected and used for the substrate 12 according to required functions or purposes.

In an exemplary embodiment of the present application, the substrate 12 may be one of various metals and polymer sheets. The metal may be aluminum (Al) or iron (Fe). The polymer sheet may be a polyether-based sheet, a polyamide-based sheet, or a polyimide-based sheet. Among these, the polyether-based sheet may be typically used as the substrate, but the present application is not limited thereto. The polyether-based sheet may be, for example, a single sheet, a stacked sheet, or a co-extrusion of polyethylene terephthalate (PET), polyethylene naphthalate (PEN), or polybutylene terephthalate (PBT), but the present application is not limited thereto.

In addition, a polyether-based sheet having high hydrolysis resistance may be used as the substrate. The polyether-based sheet having high hydrolysis resistance may be formed of a material that may generate a low content of oligomer during condensation polymerization. Also, known thermal treatment for improving the hydrolysis resistance may be further performed on the polyether-based sheet to reduce a moisture-content of polyester and shrinkage, thereby further enhancing the hydrolysis resistance of the polyester-based sheet. Furthermore, a currently available product may be used as a sheet having a high hydrolysis resistance.

The thickness of the substrate is not specifically limited, but may range from approximately 50 μm to 500 μm, or, approximately 100 μm to 300 μm. By controlling the thickness of the substrate as described above, the multilayered film may maintain good electrical insulating, moisture-proofing, and mechanical characteristics and high convenience in handling. However, the thickness of the substrate is not limited to the above-described range and may be appropriately controlled as needed.

To further improve an adhesive strength with respect to the resin layer 11 containing an fluorine-based polymer, surface treatment, for example, radio-frequency (RF) spark discharge treatment, such as corona treatment or plasma treatment; heat treatment; flame treatment; coupling-agent treatment; primer treatment; or chemical activation treatment using vapor of Lewis acid (e.g., $BF_3$), sulfuric acid, or high-temperature sodium hydroxide, may be performed on the substrate 12 according to the exemplary embodiments of the present application.

Furthermore, an inorganic oxide, such as silicon oxide or aluminum oxide, may be deposited on the substrate to further improve a moisture-proof characteristic. In this case, a surface treatment may be performed on a deposition processing layer using the above-described spark discharge such as corona or plasma, flame, an anchor agent, a coupling agent, primer, or chemical activation.

The multilayered film 10 according to the present application may include the resin layer 11 formed on the substrate 12 and including the fluorine-based polymer and the acrylic polymer containing the reactive functional group. The resin layer 11 may include not only the fluorine-based polymer but also the acrylic polymer containing the reactive functional group to improve adhesion of the fluorine-based polymer to the substrate 12. That is, the acrylic polymer, which is highly compatible with the fluorine-based polymer, may be selected to facilitate formation of a blend of the acrylic polymer and the fluorine-based polymer in the resin layer. Also, since the acrylic polymer contains the reactive functional group, a glass transition temperature and molecular weight distribution of the copolymer may be controlled or solubility may be increased.

The reactive functional group included in the acrylic polymer of the resin layer of the multilayered film according to the present application is not limited to specific kinds, but may be, for example, a reactive functional group having a high dipole moment, which may improve an adhesive strength and mechanical properties due to interaction with dipole of a $C—F_2$ bond of the fluorine-based polymer.

The reactive functional group may be at least one selected from the group consisting of a carboxyl group, an amide group, an amino group, an epoxy group, a hydroxyl group, an acid anhydride group, an isocyanate group, a sulfonic acid group, an aziridine group, an amine group, a urea group, a phosphoric acid group, a cyano group, a cyanate group, an imidazole group, an oxazoline group, and an imine group, preferably, at least one selected from the group consisting of a carboxyl group, an epoxy group, and an oxazoline group, but the present application is not limited thereto.

In the exemplary embodiments of the present application, a material capable of introducing or providing the reactive functional group to the acrylic polymer is not limited to specific kinds, and compounds widely known in the art may be used as the material capable of introducing a reactive functional group. For example, an acrylic polymer containing the reactive functional group may be provided by copolymerizing at least one acrylic compound selected from the group consisting of (meth)acrylate, alkyl (meth)acrylate, and isobornyl (meth)acrylate and at least one monomer containing the reactive functional group. In addition, a copolymer may be manufactured by further adding an aromatic vinyl monomer, such as styrene.

To provide the balance of compatibility with the fluorine-based polymer and a good adhesive strength, the acrylic polymer may be a (meth)acrylic polymer containing at least one alkyl (meth)acrylate having an alkyl group with 1 through 14 carbon atoms as a main component. The (meth)acrylic polymer containing at least one alkyl (meth)acrylate as the main component may be a (meth)acrylate polymer containing approximately 50 to 99.9% by weight of at least one alkyl (meth)acrylate as a monomer component.

In exemplary embodiments of the present application, specific examples of the alkyl (meth)acrylate may be, for instance, methyl (meth)acrylate, ethyl (meth)acrylate, propyl (meth)acrylate, n-butyl (meth)acrylate, s-butyl (meth)acrylate, t-butyl (meth)acrylate, isobutyl (meth)acrylate, hexyl (meth)acrylate, 2-ethylhexyl (meth)acrylate, n-octyl (meth)acrylate, isooctyl (meth)acrylate, n-nonyl (meth)acrylate, isononyl (meth)acrylate, n-decyl (meth)acrylate, isodecyl (meth)acrylate, n-dodecyl (meth)acrylate, n-tridecyl (meth)acrylate, and n-tetradecyl (meth)acrylate.

A polymerizable monomer capable of providing the reactive functional group may include at least one component having a functional group which contributes to improving an adhesive strength, for example, a carboxyl group-containing monomer, an amide group-containing monomer, an amino group-containing monomer, an epoxy group-containing monomer, a hydroxyl group-containing monomer, an acid anhydride group-containing monomer, an isocyanate group-containing monomer, a sulfonic acid group-containing monomer, an aziridine group-containing monomer, an amine group-containing monomer, a urea group-containing monomer, a phosphoric acid group-containing monomer, a cyano group-containing monomer, a cyanate group-containing monomer, an imidazole group-containing monomer, an oxazoline group-containing monomer, and an imine group-containing monomer, which may be used alone or in a combination thereof.

The carboxyl group-containing monomer may be, for example, acrylic acid, methacrylic acid, carboxyethyl (meth)acrylate, carboxypentyl (meth)acrylate, itaconic acid, maleic acid, fumaric acid, or crotonic acid. Among these, acrylic acid and methacrylic acid may be effectively used as the carboxyl group-containing monomer.

The amide group-containing monomer may be, for example, (meth)acrylamide, diethylacrylamide, N-vinylpyrrolidone, N,N-dimethyl (meth)acrylamide, N,N-diethyl (meth)acrylamide, N,N'-methylenebisacrylamide, N,N-dimethylaminopropylacrylamide, N,N-diethylaminopropylmethacrylamide, or diacetone (meth)acrylamide.

The amino group-containing monomer may be, for example, aminoethyl (meth)acrylate, N,N-dimethylaminoethyl (meth)acrylate, or N,N-dimethylaminopropyl (meth)acrylate.

The epoxy group-containing monomer may be, for example, glycidyl (meth)acrylate, glycidylalkyl (meth)acrylate such as methylglycidyl (meth)acrylate, or allylglycidylether.

The hydroxyl group-containing monomer may be, for example, hydroxyalkyl (meth)acrylate, such as 2-hydroxyethyl (meth)acrylate, 2-hydroxypropyl (meth)acrylate, 4-hydroxybutyl (meth)acrylate, 2-hydroxyhexyl (meth)acrylate, 2-hydroxybutyl (meth)acrylate, 6-hydroxyhexyl (meth)acrylate, 8-hydroxyoctyl (meth)acrylate, or 10-hydroxydecyl (meth)acrylate, 12-hydroxylauryl (meth)acrylate, (4-hydroxymethylcyclohexyl) methylacrylate, N-methylol (meth)acrylamide, N-hydroxy (meth)acrylamide, vinylalcohol, allylalcohol, 2-hydroxyethyl vinylether, 4-hydroxybutylether, or diethyleneglycol monovinylether.

The acid anhydride group-containing monomer may be, for example, maleic anhydride, itaconic anhydride, or anhydride of the carboxyl group-containing monomer.

The isocyanate group-containing monomer may be a phenol or methylethyl ketooxym additive of (meth)acryloyl isocyanate or (meth)acryloyl isocyanateethyl.

The sulfonic acid group-containing monomer may be, for example, styrene sulfonic acid, p-toluene sulfonic acid, allyl sulfonic acid, 2-(meth)acrylamide-2-methylpropane sulfonic acid, (meth)acrylamide propane sulfonic acid, sulfopropyl (meth)acrylate, (meth)acryloyloxy naphthalene sulfonic acid, or sodium vinylsulfonate.

The aziridine group-containing monomer may be, for example, vinyl aziridine or divinyl aziridine.

The amine group-containing monomer may be, for example, allylamine.

The urea group-containing monomer may be, for example, methacryloxyethyl ethylene urea, a (meth)acrylate derivative of 2-hydroxyethyl ethylene urea, or a (meth)acrylamide derivative of 2-aminoethylene urea.

The phosphoric acid group-containing monomer may be, for example, 2-hydroxyethyl acryloyl phosphate.

The cyano group-containing monomer may be, for example, acrylonitrile or methacrylonitrile.

The cyanate group-containing monomer may be, for example, 1,1-bis-(4-cyanatophenyl)ethane, 2,2-bis(4-cyanatophenyl)propane, bis(3,5-dimethyl-4-cyanatophenyl)methane, 4,4'-(1,3-phenylenediisopropylidene)diphenylcyanate, or cyanide-oxidized novolac oligomer.

The imidazole group-containing monomer may be, for example, vinyl imidazole or allyl imidazole.

The oxazoline group-containing monomer may be, for example, 2-vinyl-2-oxazoline, 2-vinyl-4-methyl-2-oxazoline, 2-vinyl-5-methyl-2-oxazoline, 2-isoprophenyl-2-oxazoline, 2-isoprophenyl-4-methyl-2-oxazoline, or 2-isoprophenyl-5-ethyl-2-oxazoline.

The imine group-containing monomer may be, for example, ethylene imine or propylene imine.

The polymerizable monomer capable of providing the reactive functional group may be appropriately selected and used. For example, the polymerizable monomer capable of providing the reactive functional group may be glycidyl (meth)acrylate, glycidyl alkyl (meth)acrylate, (meth)acrylic acid, isocyanato alkyl (meth)acrylate, (meth)acrylonitrile, cyclohexyl maleimide, hydroxy alkyl (meth)acrylate, maleic anhydride, p-toluene sulfonic acid, phosphoric acid, (meth)acrylamide, aminoalkyl (meth)acrylate, vinyl imidazole, or 2-isopropenyl-2-oxazoline.

In the present application, one of the above-described monomers containing the reactive functional groups or a mixture of at least two thereof may be used.

In addition, an acrylic polymer containing a reactive functional group may be manufactured by further adding an aromatic vinyl compound, for example, styrene, chlorostyrene, chloromethylstyrene, methylstyrene, or another substituted styrene.

In the case of the content of the reactive functional group of the acrylic polymer containing the reactive functional group which may be used in the exemplary embodiments of the present application, a molecular weight corresponding to one reactive functional group, that is, an equivalent weight of the reactive functional group, may be 30,000 or less, 800 to 30,000, or 2000 to 20,000. When the equivalent weight of the reactive functional group exceeds 30,000, the reactive functional group may be unlikely to contribute toward improving an adhesive strength of the resin layer.

The term "equivalent weight of the reactive functional group" refers to a numerical value obtained by dividing the entire molecular weight of the reactive functional group included in the entire polymer by the number of the corresponding reactive functional groups and may be measured using a chemical titration known in the art.

The acrylic polymer containing the reactive functional group used in the present application may have a weight-average molecular weight of a hundred thousand to five million. In the present application, the term "weight-average molecular weight" refers to a converted numerical value of standard polystyrene measured using gel permeation chromatography (GPC). When the acrylic polymer containing the reactive functional group has a weight-average molecular weight of less than one hundred thousand, the acrylic polymer containing the reactive functional group may have low cohesive force and thus, be poorly adhesive to the fluorine-based polymer. In contrast, when the acrylic polymer containing the reactive functional group has a weight-average molecular weight of more than five million, the acrylic polymer may have low mobility and cause delamination.

A method of polymerizing the acrylic polymer containing the reactive functional group used in the present application is not specifically limited, but the acrylic polymer containing the reactive functional group may be polymerized using a known method, such as solution polymerization, emulsion polymerization, bulk polymerization, or suspension polymerization. Also, the resultant polymer may be any one of a random copolymer, a block copolymer, an alternating copolymer, and a graft copolymer. Various methods of introducing a desired functional group to a polymer are already known in the art and may be applied to the present application.

The fluorine-based polymer, which may be mixed with the acrylic polymer containing the reactive functional group and form the resin layer 11 of the multilayered film 10 according to the present application, is not limited to specific kinds and may be a homopolymer, a copolymer, or a mixture thereof, which may contain, in a polymerized form, at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro -2,2-dimethyl-1,3-dioxole (PDD), and perfluoro-2-methylene-4-methyl-1,3-dioxolane (PMD).

In the present application, the fluorine-based polymer may be a homopolymer or copolymer containing VDF in a polymerized form; a homopolymer or copolymer containing VF in a polymerized form; or a mixture thereof. More preferably, the fluorine-based polymer may be a copolymer containing VDF in a polymerized form.

In addition, the fluorine-based polymer may be a copolymer of VDF or VF with at least one comonomer. The comonomer that may be included in the copolymer in a polymerized form is not limited to specific kinds and may be, but is not limited to, at least one selected from the group consisting of tetrafluoroethylene (TFE), hexafluoropropylene (HFP), chlorotrifluoroethylene (CTFE), trifluoroethylene, hexafluoroisobutylene, perfluoro-butylethylene, PMVE, PEVE, PPVE, PHVE, PDD, and PMD. Preferably, the comonomer that may be included in the copolymer in a polymerized form may be, but is not limited to, at least one selected from the group consisting of HFP and CTFE.

In addition, the comonomer may be contained in the copolymer at a content of, for example, approximately 0.5 to 50% by weight, approximately 1 to 40% by weight, approximately 7 to 40% by weight, approximately 10 to 30% by weight, or approximately 10 to 20% by weight, based on the total weight of the copolymer. When the content of the comonomer is within the content range, the multilayered film may ensure good durability and weatherability, and effective inter-diffusion and a low-temperature drying process may be enabled.

In the exemplary embodiments of the present application, the fluorine-based polymer may have a weight-average molecular weight of 50,000 to 1,000,000. In the present application, by controlling the weight-average molecular weight of the resin layer as described above, high solubility and good physical properties may be ensured.

In the exemplary embodiments of the present application, the fluorine-based polymer may have a melting point of approximately 80° C. to approximately 175° C., or approximately 120° C. to approximately 165° C. Deformation of the multilayered film may be prevented during use by controlling a melting point of resin to approximately 80° C. or higher, while solubility of resin in a solvent may be controlled, and gloss of a coated surface may be improved by controlling the melting point of the resin to approximately 175° C. or lower.

In the exemplary embodiments of the present application, in a mixture of the fluorine-based polymer and the acrylic polymer containing the reactive functional group, which are included in the resin layer, the acrylic polymer containing the reactive functional group may be contained at a content of approximately 50% or less by weight, or approximately 2 to 30% by weight. When the content of the acrylic polymer containing the reactive functional group exceeds 50% by weight, mechanical properties and weatherability of the resin layer may be degraded.

In addition to the above-described components, the resin layer according to the present application may further include a pigment or filler to control color or opacity of the resin layer or attain other objects. In this case, examples of the pigment or filler may be a metal oxide, such as titanium dioxide ($TiO_2$), silica, or alumina, a black pigment, such as calcium carbonate ($CaCO_3$), barium sulfate ($BaSO_4$), or carbon black, or a pigment component showing another color, but the pigment or filler is not limited thereto. The pigment or filler may not only serve a unique function to control the color or opacity of the resin layer but also further improve an adhesive strength of the resin layer due to a functional group unique to each component.

Other additives, such as the pigment or filler, may be contained at a content of approximately 60% by weight based on a solid content of the mixture of the fluorine-based polymer and the acrylic polymer containing the reactive functional group, but the present application is not limited thereto.

Also, the resin layer according to the present application may further include a typical component, such as an ultraviolet (UV) stabilizer, a thermal stabilizer, or barrier particles.

In the present application, the resin layer including the above-described components may have a thickness of approximately 3 μm to approximately 50 μm, or approximately 10 μm to approximately 30 μm. When the resin layer including the fluorine-based polymer and the acrylic polymer containing the reactive functional group has a thickness less than approximately 3 μm, since the resin layer is excessively thin, the resin may be insufficiently filled with a filler to degrade a light blocking property. When the resin layer including the fluorine-based polymer and the acrylic polymer containing the reactive functional group has a thickness more than approximately 50 μm, manufacturing costs may be increased.

A multilayered film according to an exemplary embodiment of the present application may include: a substrate; and a resin layer disposed on the substrate and including an fluorine-based polymer and an acrylic polymer containing a reactive functional group. An equivalent weight of the reactive functional group with respect to the entire polymer of the resin layer is 30,000 or less. The above-described multilayered film may be used as a back sheet for a photovoltaic sheet.

In the present application, the resin layer including the fluorine-based polymer and the acrylic polymer containing the reactive functional group may be a coating layer. In the present application, the term "coating layer" refers to a resin layer formed using a coating process. More specifically, the coating layer refers to the resin layer including the fluorine-based polymer and the acrylic polymer containing the reactive functional group, which is formed not by laminating a sheet prepared using a casting method or an extrusion method on a substrate using an adhesive but by coating a coating solution prepared by dissolving a component constituting the resin layer in a solvent, preferably, a solvent having a low boiling point.

FIG. 1 illustrates a case where the multilayered film 10 according to exemplary embodiments of the present application includes the resin layer 11 formed on only one surface of the substrate 12. However, a multilayered film (not shown) according to other exemplary embodiments of the present application may include a resin layer formed on both surfaces of a substrate.

In addition, the multilayered film according to the exemplary embodiments of the present application may further include various functional layers known in the art, as needed. The functional layer may be, for example, an adhesive layer or an insulating layer. For example, the above-described resin layer may be formed on one surface of the substrate of the multilayered film according to the present application, while an adhesive layer and an insulating layer may be sequentially formed on the other surface of the substrate. The adhesive layer or insulating layer may be formed using one of various methods known in the art. For instance, the insulating layer may be an ethylene vinyl acetate (EVA) layer or a linear low-density polyethylene (LDPE) layer. The EVA layer or the LDPE layer may not only function as an insulating layer but also improve adhesion of the multilayered film to an encapsulant, reduce manufacturing costs, and maintain good re-workability.

Other exemplary embodiments of the present application provide a method of manufacturing a multilayered film, which includes forming a resin layer including an fluorine-based polymer and an acrylic polymer containing a reactive functional group on a substrate. Herein, an equivalent weight of the reactive functional group with respect to the entire polymer of the resin layer may be 30,000 or less.

In the exemplary embodiments of the present application, a method of forming the resin layer on the substrate is not specifically limited. For example, the resin layer may be formed according to various methods known in the art, for example by coating a substrate with a coating solution prepared by dissolving or dispersing the above-described fluorine-based polymer and acrylic polymer containing the reactive functional group in an appropriate organic solvent or aqueous solvent, and drying the coating solution under predetermined conditions. In this case, the coating method is not specifically limited and any coating method by which a uniform coating layer may be formed may be used without any particular limitation. For example, the coating method may be a known printing process, such as an offset printing process or a gravure printing process or a known coating process, such as a roll coating process, a knife edge coating process, or a gravure coating process. In the present application, various other methods known in the art may be applied, and the coating solution may further include various other additives as needed.

Specific kinds of the substrate used in the method of the present application are the same as described above, and a substrate may be previously subjected to an appropriate deposition process, thermal treatment, plasma treatment, or corona treatment, or a substrate that has already been subjected to such treatment may also be used.

In the exemplary embodiments of the present application, a coating solution (i.e., a resin composition) required for forming the resin layer may be prepared by dissolving or dispersing respective components forming the above-described resin layer in a solvent having a relatively low boiling point, specifically, a solvent having a boiling point of approximately 200° C. or lower. That is, according to the present application, the fluorine-based polymer may be mixed with the acrylic polymer containing the reactive functional group and effectively dissolved in a solvent having a relatively low boiling point. Thus, since a method of manufacturing a multilayered film according to the present application does not require a high-temperature drying process, manufacturing costs may be reduced, and the substrate may be prevented from being thermally deformed or shocked during the high-temperature drying process, thereby improving the quality of products.

Examples of the solvent that may be used in the present application may be one of acetone, methylethyl ketone (MEK), N,N-dimethyl formamide (DMF), and dimethylacetamide (DMAC) or a mixture of at least two thereof, but the solvent is not limited thereto.

The solvents such as MEK, DMF, and DMAC, which evaporate at a temperature of approximately 200° C. or lower, may easily dissolve a coating material for the resin layer including the fluorine-based polymer and the acrylic polymer containing the reactive functional group. Also, the solvent, such as MEK, DMF, and DMAC, may be dried at a relatively low temperature after being coated on the substrate along with the coating material. Also, the solvent of the coating solution may swell a surface of the substrate or a surface-treated layer of the substrate during the coating process so that inter-diffusion between the substrate and the fluorine-based polymer and the acrylic polymer containing the reactive functional group of the resin layer may occur at an interface, which is a contact surface between the substrate and the resin layer including the fluorine-based polymer and the acrylic polymer containing the reactive functional group coated on the substrate. Thus, physical and chemical cohesion between the resin layer and the substrate may be improved to further increase an adhesive strength between the substrate and the resin layer.

That is, the acrylic polymer containing the reactive functional group may reduce the crystallinity of the fluorine-based polymer and increase an amorphous region where the inter-diffusion may occur, thereby improving cohesive force at the interface between the resin layer and the substrate.

In the present application, in addition to the fluorine-based polymer and the acrylic polymer containing the reactive functional group, the coating solution used for forming the resin layer may further include various additives, such as a pigment, a filler, a UV stabilizer, or a thermal stabilizer. Each of the additives may be dissolved in a solvent along with the fluorine-based polymer or manufactured as a mill base type independently from the above-described components and then mixed with the solvent including the fluorine-based polymer and the acrylic polymer containing the reactive functional group. Due to functional groups included in additives, such as a filler and a dispersant, which may be included in the resin layer, chemical interaction, such as van der Waals bond, hydrogen bond, ionic bond, or covalent bond, may occur, and an adhesive strength between the resin layer and the substrate may be further enhanced.

In the present application, a method of manufacturing a coating solution or a ratio of respective components included in the coating solution is not specifically limited, and various methods known in the art may be appropriately adopted.

In the present application, the coating process may be further followed by drying the coated coating solution. Drying conditions are not specifically limited. For example, the drying process may be performed at a temperature of approximately 200° C. or lower, or approximately 100° C. to approximately 180° C. for approximately 30 seconds to approximately 30 minutes, or approximately 1 to 10 minutes. By controlling the drying conditions as described above, a rise in the manufacturing cost may be prevented, and degradation in the quality of products due to thermal deformation or thermal shock may be prevented.

Other exemplary embodiments of the present application provide a back sheet for a photovoltaic cell, which includes the multilayered film.

As described above, the back sheet for the photovoltaic cell may include a resin layer including a mixture of an fluorine-based polymer and an acrylic polymer. Since the acrylic polymer includes the reactive functional group, chemical covalent bond between the resin layer and a functional group of the substrate may be enabled to improve an adhesive strength. Specifically, the fluorine-based polymer and the acrylic polymer containing the reactive functional group, which are included in the resin layer, may diffuse into the substrate or the surface-treated layer of the substrate at an interface between the resin layer and the substrate or the surface-treated layer of the substrate during the manufacture of the back sheet for the photovoltaic cell. Thus, chemical covalent bond may be formed between the substrate and the resin layer, and an adhesive strength may be improved due to chain entanglement and van der Waals force.

In addition, yet other exemplary embodiments of the present application provide a photovoltaic module including the back sheet for the photovoltaic cell.

A structure of the photovoltaic module according to the present application may be used without any particular limitation when the photovoltaic module includes the multilayered film as the back sheet for the photovoltaic cell. The photovoltaic module according to the present application may have any one of various structures known in the art.

In general, the photovoltaic module may include a transparent front substrate, a back sheet, and a photovoltaic cell or photovoltaic array encapsulated between the front substrate and the back sheet using an encapsulant.

An active layer constituting the photovoltaic cell or the photovoltaic array may be, for example, a crystalline or amorphous silicon wafer or a compound semiconductor, such as copper indium gallium selenide (CIGS) or cadmium tellurium sulfide (CTS).

The multilayered film according to the present application may be applied without any particular limitation to various photovoltaic modules known in the art including a module having the above-described active layer. In this case, neither a method of forming the module nor the kind of materials of the module is specifically limited.

Hereinafter, exemplary embodiments of the present application will be described in detail. However, the present application is not limited to the embodiments disclosed below, but can be implemented in various forms. The following embodiments are described in order to enable those of ordinary skill in the art to embody and practice the present application.

Respective physical properties of each of films manufactured in Examples and Comparative Examples were measured in the following manners.

180-Degree Peel Strength

According to ASTM D1897, a sample was cut to a width of approximately 10 mm, and peel strength was measured while delaminating the sample at a rate of approximately 4.2 mm/sec and a delamination angle of approximately 180°.

Cross-Hatch Adhesion

A cross-cut test was performed according to standards ASTM D3002/D3359. Specifically, 11 rows and 11 columns were drawn at intervals of 1 mm by a knife on a sample to form 100 square gratings, each grating being 1 mm wide and 1 mm long. Thereafter, when a CT-24 adhesive tape available from Nichiban was adhered to a cut surface and detached from the cut surface, a surface state of the sample from which the gratings are detached along with the adhesive tape was measured and estimated according to the following standards.

Standards for Estimation of Cross-Hatch Adhesion

5B: when no surface is detached

4B: when a detached surface is 5% or less of the entire area of the sample

3B: when the detached surface is between 5% and 15% of the entire area of the sample 2B: when the detached surface is between 15% and 35% of the entire area of the sample 1B: when the detached surface is between 35% and 65% of the entire area of the sample 0B: when almost the entire surface is detached Damp Heat Test A multilayered film in which both surfaces of a substrate were coated with a resin layer including an fluorine-based polymer and an acrylic polymer containing a reactive functional group, which was manufactured in each of Examples and Comparative examples, was left in an oven maintained at a temperature of approximately 85° C. at an R.H. of 85% for 1000 hours, 2000 hours, or 3000 hours, and a variation in adhesive strength was observed. In the present specification, the unit "R.H." refers to a relative humidity.

Pressure Cooker Test (PCT)

A multilayered film in which both lateral surfaces of a substrate were coated with a resin layer including an fluorine-based polymer and an acrylic polymer containing a reactive functional group, which was manufactured in each of Examples and Comparative examples, was left in an oven maintained under an atmospheric pressure of 2 at a temperature of approximately 121° C. at an R.H. of 100% for 25 hours, 50 hours, 75 hours, or 100 hours, and a variation in adhesive strength was observed.

Preparation Example 1

Preparation of Substrate Layer

A surface of a 250 μm-thick PET film (available from Kolon) having both surfaces treated with acryl primer was treated with corona.

Preparation of Fluorine-Based Polymer

To prepare a mixture of an fluorine-based polymer and an acrylic polymer containing a reactive functional group, various fluorine-based polymers were prepared as shown in Table 1. Table 1 shows molecular weights and melting points of fluorine-based polymers used in Examples and Comparative examples.

TABLE 1

| | Polymer | Monomer ratio (Weight ratio) | Weight-average molecular weight (Mw) | Melting point (° C.) |
|---|---|---|---|---|
| 1 | VDF-HFP copolymer | 90:10 (VDF:HFP) | 330,000 | 158 |
| 2 | VDF-HFP copolymer | 88:12 (VDF:HFP) | 590,000 | 135 |
| 3 | VDF-HFP copolymer | 85:15 (VDF:HFP) | 300,000 | 132 |
| 4 | VDF-CTFE copolymer | 80:20 (VDF:CTFE) | 280,000 | 166 |
| 5 | VDF-CTFE copolymer | 85:15 (VDF:CTFE) | 270,000 | 166 |
| 6 | Branched PVDF | 100 (VDF) | 550,000 | 160 |
| 7 | PVDF | 100 (VDF) | 320,000 | 169 |

VDF: vinylidene fluoride
CTFE: chlorotrifluoro ethylene
HFP: hexafluoropropylene
PVDF: polyvinylidene-fluoride homopolymer Example 1

Preparation of Coating Solution for Resin Layer 120 g of polymer 5 prepared in Preparation example 1, 60 g of polymer 2 prepared in Preparation example 1, and 20 g of an acrylic polymer were previously dissolved in 600 g of DMF and 200 g of MEK to prepare a first coating solution. Here, polymer 5 is a copolymer obtained by polymerizing VDF and CTFE in a weight ratio of 85:15, and polymer 2 is a copolymer obtained by polymerizing VDF and HFP in a weight ratio of 88:12. Also, the acrylic polymer may include an epoxy group containing methyl methacrylate (MMA), glycidyl methacrylate (GMA), butyl methacrylate (BMA), and styrene (ST) in a weight ratio of 49.5:35.5:10:5 and have an epoxy equivalent weight of 400 g.

In addition, 4.8 g of a pigment dispersant, BYK W9010 (available from BYK) and 160 g of titanium dioxide ($TiO_2$)

(TiPure TS6200 available from Dupont) were dissolved in 100 g of DMF, 100 g of zirconia beads with a diameter of approximately 0.3 mm were put in the solution, the resultant solution was stirred at a rate of approximately 1000 rpm for 1 hour, and the zirconia beads were completely removed to prepare a mill base. The prepared mill base was put in a previously prepared first coating solution and stirred again to prepare a coating solution for a resin layer. Here, the mill base was prepared in an amount equal to 1.5 times an amount actually put in the resin layer in consideration of an amount lost during the removal of the zirconia beads.

Coating and Drying Processes

The coating solution for the resin layer was coated on the previously prepared substrate using a comma reverse method. Specifically, the coating solution for the resin layer was coated by controlling intervals so that the dried coating solution could have a thickness of approximately 20 μm to approximately 30 μm. Thereafter, the coated substrate was allowed to sequentially pass through three ovens, each of which has a length of approximately 2 m, at a rate of approximately 1 m/min, while maintaining the three ovens at temperatures of approximately 80° C., 170° C., and 170° C., respectively. Thus, a resin layer was formed. Afterwards, a coating process was performed in the same manner on an opposite surface to the resin layer, thereby manufacturing a multilayered film including a PET film having both surfaces coated with an fluorine-based polymer and an acrylic polymer containing an epoxy group.

Example 2

A multilayered film was prepared in the same manner as in example 1 except that TiO$_2$ was not used.

Examples 3 Through 10

Multilayered films were manufactured in the same manner as in Example 1 except that the kind and composition ratio of an fluorine-based polymer included in a coating solution for a resin layer and the content of TiO$_2$ were changed as shown in Table 2.

Comparative Example 1

Icosolar 2442 commercially available from Isovolta was used as a multilayered film. Icosolar 2442 is a product obtained by laminating a 38 μm-thick poly(vinyl fluoride) (PVF) film manufactured using an extrusion process on both surfaces of a PET film using an adhesive.

Comparative Example 2

Icosolar 3469 commercially available from Isovolta was used as a multilayered film. Icosolar 3469 is a product obtained by laminating a 25 μm-thick PVF film manufactured using a casting process on both surfaces of a PET film using an adhesive.

TABLE 2

| | Coating solution | | | | |
|---|---|---|---|---|---|
| | Fluorine-based polymer | | Acrylic polymer | Epoxy equivalent weight (g/eq.) in | Titanium dioxide |
| | Composition | Content (g) | Content (g) | coating layer | Content (g) |
| Example 1 | polymer 5 | 120 | 20 | 4000 | 160 |
| | polymer 2 | 60 | | | |
| Example 2 | polymer 5 | 120 | 20 | 4000 | 0 |
| | polymer 2 | 60 | | | |
| Example 3 | polymer 1 | 120 | 20 | 4000 | 160 |
| | polymer 2 | 60 | | | |
| Example 4 | polymer 4 | 100 | 20 | 4000 | 280 |
| | polymer 2 | 80 | | | |
| Example 5 | polymer 4 | 100 | 20 | 4000 | 140 |
| | polymer 1 | 80 | | | |
| Example 6 | polymer 4 | 120 | 20 | 4000 | 160 |
| | polymer 2 | 60 | | | |
| Example 7 | polymer 5 | 120 | 20 | 4000 | 160 |
| | polymer 1 | 60 | | | |
| Example 8 | polymer 4 | 100 | 20 | 4000 | 160 |
| | polymer 6 | 80 | | | |
| Example 9 | polymer 5 | 120 | 20 | 4000 | 100 |
| | polymer 6 | 60 | | | |
| Example 10 | polymer 5 | 120 | 20 | 4000 | 160 |
| | polymer 7 | 60 | | | |
| Comparative example 1 | Icosolar 2442 | | — | — | — |
| Comparative example 2 | Icosolar 3469 | | — | — | — |

Experimental Example 1

A PCT was performed on each of the multilayered films obtained in Examples 1 through 10 and Comparative examples 1 and 2, and 180-degree peel strength and cross-hatch test were then performed on each of the multilayered films. Specifically, each of the multilayered films was left under an atmospheric pressure of 2 at a temperature of approximately 121° C. at an R.H. of 100% for 50 hours, 75 hours, or 100 hours and the 180-degree peel strength and cross-hatch test were performed. A variation in adhesive strength was estimated, and estimation results are shown in Table 3.

TABLE 3

| | 180-degree peel strength (N/cm) | | | | Cross-hatch test results | | | |
|---|---|---|---|---|---|---|---|---|
| | Initial stage | 50 hrs | 75 hrs | 100 hrs | Initial stage | 50 hrs | 75 hrs | 100 hrs |
| Example 1 | Coat-T | Coat-T | Coat-T | PET-T | 5B | 5B | 5B | PET-T |
| Example 2 | Coat-T | Coat-T | Coat-T | PET-T | 5B | 5B | 5B | PET-T |
| Example 3 | Coat-T | Coat-T | Coat-T | PET-T | 5B | 5B | 5B | PET-T |

TABLE 3-continued

|  | 180-degree peel strength (N/cm) | | | | Cross-hatch test results | | | |
|---|---|---|---|---|---|---|---|---|
|  | Initial stage | 50 hrs | 75 hrs | 100 hrs | Initial stage | 50 hrs | 75 hrs | 100 hrs |
| Example 4 | Coat-T | Coat-T | Coat-T | PET-T | 5B | 5B | 5B | PET-T |
| Example 5 | Coat-T | Coat-T | Coat-T | PET-T | 5B | 5B | 5B | PET-T |
| Example 6 | Coat-T | Coat-T | Coat-T | PET-T | 5B | 5B | 5B | PET-T |
| Example 7 | Coat-T | Coat-T | Coat-T | PET-T | 5B | 5B | 5B | PET-T |
| Example 8 | Coat-T | Coat-T | Coat-T | PET-T | 5B | 5B | 5B | PET-T |
| Example 9 | Coat-T | Coat-T | Coat-T | PET-T | 5B | 5B | 5B | PET-T |
| Example 10 | Coat-T | Coat-T | Coat-T | PET-T | 5B | 5B | 5B | PET-T |
| Comparative example 1 | PVF-T | PVF-T | PVF-T | 0 | 5B | 5B | 1B | 0B |
| Comparative example 2 | 7 | 0.5 | 0 | 0 | 5B | 1B | 1B | 0B |

Coat-T: when the resin layer tore during delamination and exact measurement of peel strength was impossible
PET-T: when the PET film tore during delamination and measuring precise peel strength was impossible
PVF-T: when the PVF film tore during delamination and measuring precise peel strength was impossible As shown in Table 3, in the case of the multilayered films obtained in Examples of the present application, the resin layer including the mixture of the fluorine-based polymer and the acrylic polymer containing epoxy serving as the reactive functional group exhibited a high initial adhesive strength with respect to the PET substrate and also maintained a good adhesive strength with respect to the PET substrate even after the PCT was performed for approximately 100 hours. Also, even after the PCT was performed for approximately 100 hours, external changes, such as delamination and formation of pinholes, were not observed from the resin layer. Conversely, in the case of the commercially available multilayered films, Icosolar 2442 and 3469, it was confirmed that an adhesive strength with respect to the substrate was greatly degraded during the PCT.

Experimental Example 2

A damp heat test was performed on each of the multilayered films obtained in Examples 1 through 10 and Comparative examples 1 and 2, and 180-degree peel strength and cross-hatch tests were then performed on each of the multilayered films. Specifically, each of the multilayered films was let to sit in an oven at a temperature of approximately 85° C. at an R.H. of 85% for 1000 hours, 2000 hours, or 3000 hours and the 180-degree peel strength and cross-hatch test were performed. A variation in peel strength was estimated, and estimation results are shown in Table 4.

TABLE 4

|  | 180-degree peel strength (N/cm) | | | | Cross-hatch test results | | | |
|---|---|---|---|---|---|---|---|---|
|  | Initial stage | 1000 hrs | 2000 hrs | 3000 hrs | Initial stage | 1000 hrs | 2000 hrs | 3000 hrs |
| Example 1 | Coat-T | Coat-T | Coat-T | PET-T | 5B | 5B | 5B | 5B |
| Example 2 | Coat-T | Coat-T | Coat-T | PET-T | 5B | 5B | 5B | 5B |
| Example 3 | Coat-T | Coat-T | Coat-T | PET-T | 5B | 5B | 5B | 5B |
| Example 4 | Coat-T | Coat-T | Coat-T | PET-T | 5B | 5B | 5B | 5B |
| Example 5 | Coat-T | Coat-T | Coat-T | PET-T | 5B | 5B | 5B | 5B |
| Example 6 | Coat-T | Coat-T | Coat-T | PET-T | 5B | 5B | 5B | PET-T |
| Example 7 | Coat-T | Coat-T | Coat-T | PET-T | 5B | 5B | 5B | 5B |
| Example 8 | Coat-T | Coat-T | Coat-T | PET-T | 5B | 5B | 5B | 5B |
| Example 9 | Coat-T | Coat-T | Coat-T | PET-T | 5B | 5B | 5B | 5B |
| Example 10 | Coat-T | Coat-T | Coat-T | PET-T | 5B | 5B | 5B | 5B |
| Comparative example 1 | PVF-T | PVF-T | PVF-T | 0 | 5B | 5B | 5B | 0B |
| Comparative example 2 | 7 | 2 | 0.7 | Generation of wrinkles | 5B | 5B | 4B | 0B |

Coat-T: when the resin layer tore during delamination and exact measurement of peel strength was impossible
PET-T: when the PET film tore during delamination and measuring precise peel strength was impossible
PVF-T: when the PVF film tore during delamination and measuring precise peel strength was impossible As shown in Table 4, in the multilayered films obtained in Examples of the present application, the resin layer including the mixture of the fluorine-based polymer and the acrylic polymer containing epoxy serving as the reactive functional group exhibited a high initial adhesive strength with respect to the PET substrate and also maintained a good adhesive strength with respect to the PET substrate even after the damp heat test was performed for approximately 3000 hours. Also, even after the damp heat test was performed for approximately 3000 hours, external changes, such as delamination and formation of pinholes, were not observed from the resin layer. Conversely, in the case of the commercially available multilayered films, Icosolar 2442 and 3469, it was confirmed that an adhesive strength with respect to the substrate was greatly degraded during the damp heat test.

Examples 11 Through 21 and Comparative Examples 3 Through 5

Multilayered films were manufactured in the same manner as in Example 1 except that PVDF (polymer 7), which is a single copolymer of VDF, was used as an fluorine-based polymer during manufacture of a coating solution, an epoxy equivalent weight was changed as shown in Table 5 by controlling relative amounts of the fluorine-based polymer and an acrylic polymer, and the content of $TiO_2$ included in a mill base was changed to 80 g.

Comparative Examples 6 Through 8

Multilayered films were manufactured in the same manner as in Examples 13, 15, and 17, respectively, except that polymethylmethacrylate (PMMA), which is a non-reactive polymer, was used as an acrylic polymer during manufacture of a coating solution.

TABLE 5

| | Coating solution | | | |
|---|---|---|---|---|
| | Fluorine-based polymer | Acrylic polymer | | Epoxy equivalent weight (g/eq.) in coating layer |
| | Polymer-7 content (g) | Kind | Content (g) | |
| Example 11 | 98 | Same as in Example 1 | 2 | 20,000 |
| Example 12 | 96 | Same as in Example 1 | 4 | 10,000 |
| Example 13 | 95 | Same as in Example 1 | 5 | 8000 |
| Example 14 | 92 | Same as in Example 1 | 8 | 5000 |
| Example 15 | 90 | Same as in Example 1 | 10 | 4000 |
| Example 16 | 80 | Same as in Example 1 | 20 | 2000 |
| Example 17 | 60 | Same as in Example 1 | 40 | 1000 |
| Example 18 | 50 | Same as in Example 1 | 50 | 800 |
| Example 19 | 25 | Same as in Example 1 | 75 | 533 |
| Example 20 | 20 | Same as in Example 1 | 80 | 500 |
| Example 21 | 10 | Same as in Example 1 | 90 | 445 |
| Comparative example 3 | 99.5 | Same as in Example 1 | 0.5 | 80,000 |
| Comparative example 4 | 99 | Same as in Example 1 | 1 | 40,000 |
| Comparative example 5 | 100 | — | — | — |
| Comparative example 6 | 95 | PMMA | 5 | — |
| Comparative example 7 | 90 | PMMA | 10 | — |
| Comparative example 8 | 60 | PMMA | 40 | — |

Experimental Example 3

A PCT was performed on each of the multilayered films obtained in Examples 11 through 21 and Comparative examples 3 through 8, and 180-degree peel strength and cross-hatch tests were then performed on each of the multilayered films. Specifically, each of the multilayered films was left under an atmospheric pressure of 2 at a temperature of approximately 121° C. at an R.H. of 100% for 25 hours, 50 hours, or 75 hours, and the 180-degree peel strength and cross-hatch test were performed. Test results are shown in Table 6.

TABLE 6

| | Epoxy equivalent weight (g/eq.) | 180-degree peel strength (N/cm) | | | | Cross-hatch test results | | | |
|---|---|---|---|---|---|---|---|---|---|
| | | Initial stage | 25 hrs | 50 hrs | 75 hrs | Initial stage | 25 hrs | 50 hrs | 75 hrs |
| Example 11 | 20,000 | Coat-T | 3 | 0.9 | Delamination | 5B | 5B | 3B | — |
| Example 12 | 10,000 | Coat-T | Coat-T | Coat-T | Coat-T | 5B | 5B | 5B | 5B |
| Example 13 | 8000 | Coat-T | Coat-T | Coat-T | Coat-T | 5B | 5B | 5B | 5B |
| Example 14 | 5000 | Coat-T | Coat-T | Coat-T | Coat-T | 5B | 5B | 5B | 5B |
| Example 15 | 4000 | Coat-T | Coat-T | Coat-T | Coat-T | 5B | 5B | 5B | 5B |
| Example 16 | 2000 | Coat-T | Coat-T | Coat-T | Coat-T | 5B | 5B | 5B | 5B |
| Example 17 | 1000 | Coat-T | Coat-T | Coat-T | Coat-T | 5B | 5B | 5B | 5B |
| Example 18 | 800 | Coat-T | Coat-T | Coat-T | Coat-T | 5B | 5B | 5B | 5B |
| Example 19 | 533 | Coat-T | Coat-T | Coat-T | Coat-T | 5B | 5B | 5B | 5B |
| Example 20 | 500 | Coat-T | Coat-T | Coat-T | Coat-T | 5B | 5B | 5B | 5B |
| Example 21 | 445 | Coat-T | Coat-T | Coat-T | Coat-T | 5B | 5B | 5B | 5B |
| Comparative example 3 | 80,000 | Coat-T | Delamination | — | — | 5B | — | — | — |
| Comparative example 4 | 40,000 | Coat-T | 2.4 | Delamination | — | 5B | 5B | — | — |
| Comparative example 5 | — | Coat-T | Delamination | — | — | 5B | Delamination | — | — |
| Comparative example 6 | — | Coat-T | Delamination | — | — | 5B | Delamination | — | — |
| Comparative example 7 | — | Coat-T | Delamination | — | — | 5B | Delamination | — | — |
| Comparative example 8 | — | Coat-T | Delamination | — | — | 5B | Delamination | — | — |

Coat-T: when the resin layer tore during delamination and exact measurement of peel strength was impossible As shown in Table 6, it can be confirmed that adhesion between the resin layer of the multilayered film and the PET substrate under high-temperature and high-humidity conditions is dependent on the content of the epoxy group in the coating layer. It can be confirmed that adhesion between the resin layer and the PET substrate was very low in Comparative example 5 in which the resin layer was formed of only PDVF. Also, it can be identified that adhesion between the resin layer and the PET substrate under high-temperature and high-humidity conditions was better in Examples 11 through 21 in which the resin layer was formed using the acrylic polymer containing the reactive functional group than in Comparative examples 6 through 8 in which the resin layer was formed of PMMA, which is an acrylic polymer devoid of a reactive functional group.

Examples 22 Through 32 and Comparative Examples 9 Through 11

Multilayered films were manufactured in the same manner as in Example 11 except that polymer 6, which is a single copolymer of branched VDF, was used as an fluorine-based polymer during manufacture of a coating solution and an epoxy equivalent weight was changed as shown in Table 7 by controlling relative amounts of the fluorine-based polymer and an acrylic polymer.

TABLE 7

| | Coating solution | | | |
|---|---|---|---|---|
| | Fluorine-based polymer | Acrylic polymer | | Epoxy equivalent weight |
| | Polymer-6 content (g) | Kind | Content (g) | (g/eq.) in coating layer |
| Example 22 | 98 | Same as in Example 1 | 2 | 20,000 |
| Example 23 | 96 | Same as in Example 1 | 4 | 10,000 |
| Example 24 | 95 | Same as in Example 1 | 5 | 8000 |
| Example 25 | 92 | Same as in Example 1 | 8 | 5000 |
| Example 26 | 90 | Same as in Example 1 | 10 | 4000 |
| Example 27 | 80 | Same as in Example 1 | 20 | 2000 |
| Example 28 | 60 | Same as in Example 1 | 40 | 1000 |
| Example 29 | 50 | Same as in Example 1 | 50 | 800 |
| Example 30 | 25 | Same as in Example 1 | 75 | 533 |
| Example 31 | 20 | Same as in Example 1 | 80 | 500 |
| Example 32 | 10 | Same as in Example 1 | 90 | 445 |
| Comparative example 9 | 99.5 | Same as in Example 1 | 0.5 | 80,000 |
| Comparative example 10 | 99 | Same as in Example 1 | 1 | 40,000 |
| Comparative example 11 | 100 | — | — | — |

Experimental Example 4

A PCT was performed on each of the multilayered films obtained in Examples 22 through 32 and Comparative examples 9 through 11, and 180-degree peel strength and cross-hatch tests were then performed on each of the multilayered films. Specifically, each of the multilayered films was left under an atmospheric pressure of 2 at a temperature of approximately 121° C. at an R.H. of 100% for 25 hours, 50 hours, or 75 hours, and the 180-degree peel strength and cross-hatch tests were performed. Test results are shown in Table 8.

TABLE 8

| | Epoxy equivalent weight (g/eq.) | 180-degree peel strength (N/cm) | | | | Cross-hatch test results | | | |
|---|---|---|---|---|---|---|---|---|---|
| | | Initial stage | 25 hrs | 50 hrs | 75 hrs | Initial stage | 25 hrs | 50 hrs | 75 hrs |
| Example 22 | 20,000 | Coat-T | 3.1 | — | — | 5B | 5B | — | — |
| Example 23 | 10,000 | Coat-T | 4.2 | Coat-T | — | 5B | 5B | 3B | — |
| Example 24 | 8000 | Coat-T | 4.9 | Coat-T | — | 5B | 5B | 4B | — |
| Example 25 | 5000 | Coat-T | Coat-T | Coat-T | Coat-T | 5B | 5B | 5B | 5B |
| Example 26 | 4000 | Coat-T | Coat-T | Coat-T | Coat-T | 5B | 5B | 5B | 5B |
| Example 27 | 2000 | Coat-T | Coat-T | Coat-T | Coat-T | 5B | 5B | 5B | 5B |
| Example 28 | 1000 | Coat-T | Coat-T | Coat-T | Coat-T | 5B | 5B | 5B | 5B |
| Example 29 | 800 | Coat-T | Coat-T | Coat-T | Coat-T | 5B | 5B | 5B | 5B |
| Example 30 | 533 | Coat-T | Coat-T | Coat-T | Coat-T | 5B | 5B | 5B | 5B |
| Example 31 | 500 | Coat-T | Coat-T | Coat-T | Coat-T | 5B | 5B | 5B | 5B |
| Example 32 | 445 | Coat-T | Coat-T | Coat-T | Coat-T | 5B | 5B | 5B | 5B |
| Comparative example 9 | 80,000 | Coat-T | Delamination | — | — | 5B | — | — | — |
| Comparative example 10 | 40,000 | Coat-T | Delamination | — | — | 5B | 1B | — | — |
| Comparative example 11 | — | Coat-T | Delamination | — | — | 5B | — | — | — |

Coat-T: when the resin layer tore during delamination and exact measurement of peel strength was impossible As shown in Table 8, it can be confirmed that adhesion between the resin layer of the multilayered film and the PET substrate under high-temperature and high-humidity conditions is dependent on the content of the epoxy group in the coating layer. It can be confirmed that adhesion between the resin layer and the PET substrate was very low in Comparative example 19 in which the resin layer was formed of only the polymer 6, while adhesion between the resin layer and the PET substrate under high-temperature and high-humidity conditions was excellent in Examples 19 through 26 in which the resin layer was formed using the acrylic polymer containing the reactive functional group.

Examples 33 Through 43 and Comparative Examples 12 and 13

Multilayered films were manufactured in the same manner as in Example 11 except that polymer 6, which is a single copolymer of branched VDF, was used as an fluorine-based polymer during manufacture of a coating solution, an acrylic polymer (having an epoxy equivalent weight of 600 g) including an epoxy group containing MMA, GMA, BMA, and ST in a weight ratio of 56.3:23.7:13.3:6.7 was used as an acrylic polymer, and an epoxy equivalent weight was changed as shown in Table 9 by controlling relative amounts of the fluorine-based polymer and the acrylic polymer.

TABLE 9

| | Coating solution | | |
|---|---|---|---|
| | Fluorine-based polymer Polymer-6 content (g) | Acrylic polymer Content (g) | Epoxy equivalent weight (g/eq.) in coating layer |
| Example 33 | 98 | 2 | 30,000 |
| Example 34 | 96 | 4 | 15,000 |
| Example 35 | 95 | 5 | 12,000 |
| Example 36 | 92 | 8 | 7500 |
| Example 37 | 90 | 10 | 6000 |
| Example 38 | 80 | 20 | 3000 |
| Example 39 | 60 | 40 | 1500 |
| Example 40 | 50 | 50 | 1200 |
| Example 41 | 25 | 75 | 800 |
| Example 42 | 20 | 80 | 750 |
| Example 43 | 10 | 90 | 667 |
| Comparative example 12 | 99.5 | 0.5 | 120,000 |
| Comparative example 13 | 99 | 1 | 60,000 |

Experimental Example 5

A PCT was performed on each of the multilayered films obtained in Examples 33 through 43 and Comparative examples 12 and 13, and 180-degree peel strength and cross-hatch tests were performed on each of the multilayered films. Specifically, each of the multilayered films was left under an atmospheric pressure of 2 at a temperature of approximately 121° C. at an R.H. of 100% for 25 hours, 50 hours, or 75 hours, and the 180-degree peel strength and cross-hatch tests were performed. Test results are shown in Table 10.

TABLE 10

| | Epoxy equivalent weight (g/eq.) | 180-degree peel strength (N/cm) | | | | Cross-hatch test results | | | |
|---|---|---|---|---|---|---|---|---|---|
| | | Initial stage | 25 hrs | 50 hrs | 75 hrs | Initial stage | 25 hrs | 50 hrs | 75 hrs |
| Example 33 | 30,000 | Coat-T | 3.1 | — | — | 5B | 5B | — | — |
| Example 34 | 15,000 | Coat-T | 4.2 | Coat-T | — | 5B | 5B | 3B | — |
| Example 35 | 12,000 | Coat-T | 4.9 | Coat-T | — | 5B | 5B | 4B | — |
| Example 36 | 7500 | Coat-T | Coat-T | Coat-T | Coat-T | 5B | 5B | 5B | 5B |
| Example 37 | 6000 | Coat-T | Coat-T | Coat-T | Coat-T | 5B | 5B | 5B | 5B |
| Example 38 | 3000 | Coat-T | Coat-T | Coat-T | Coat-T | 5B | 5B | 5B | 5B |
| Example 39 | 1500 | Coat-T | Coat-T | Coat-T | Coat-T | 5B | 5B | 5B | 5B |
| Example 40 | 1200 | Coat-T | Coat-T | Coat-T | Coat-T | 5B | 5B | 5B | 5B |
| Example 41 | 800 | Coat-T | Coat-T | Coat-T | Coat-T | 5B | 5B | 5B | 5B |
| Example 42 | 750 | Coat-T | Coat-T | Coat-T | Coat-T | 5B | 5B | 5B | 5B |
| Example 43 | 667 | Coat-T | Coat-T | Coat-T | Coat-T | 5B | 5B | 5B | 5B |
| Comparative example 12 | 120,000 | Coat-T | Delamination | — | — | 5B | — | — | — |
| Comparative example 13 | 60,000 | Coat-T | Delamination | — | — | 5B | 1B | — | — |

Coat-T: when the resin layer tore during delamination and exact measurement of peel strength was impossible As shown in Table 10, it can be confirmed that adhesion between the resin layer of the multilayered film and the PET substrate under high-temperature and high-humidity conditions is dependent on the content of the epoxy group in the coating layer. It can be confirmed that adhesion between the resin layer and the PET substrate under high-temperature and high-humidity conditions was excellent in Examples 33 through 43 in which the resin layer was formed using the acrylic polymer containing the reactive functional group.

In Comparative examples 12 and 13, it can be identified that since the epoxy equivalent weight increases to a predetermined level or higher due to a low acrylic-polymer content, a sufficient adhesive strength could not be ensured.

Since a multilayered film according to embodiments of the present application includes a resin layer including an fluorine-based polymer and an acrylic polymer containing a reactive functional group, the multilayered film may have high reliability and adhesive strength under heat-resistant and damp proof conditions and have good weatherability and durability. In addition, since the resin layer may be manufactured using a solvent having a low boiling point at a low drying temperature at low cost, manufacturing costs may be reduced. Furthermore, the multilayered film according to the embodiments of the present application may be effectively used for a back sheet for a photovoltaic cell and provide a photovoltaic module having good durability even if exposed to the outside for a long period of time.

While the invention has been shown and described with reference to certain exemplary embodiments thereof, it will be understood by those skilled in the art that various changes in form and details may be made therein without departing from the scope of the invention as defined by the appended claims.

What is claimed is:

1. A multilayered film comprising:
   a substrate; and
   a resin layer directly disposed on the substrate and including a fluorine-based polymer and an acrylic polymer containing a reactive functional group,
   wherein an equivalent weight of the reactive functional group with respect to a mixture of the fluorine-based polymer and the acrylic polymer of the resin layer is 2,000 to 20,000,
   wherein the acrylic polymer has a weight-average molecular weight of a hundred thousand to five million, and
   wherein the acrylic polymer is contained at a content of 2 to 30% by weight in the mixture of the fluorine-based polymer and the acrylic polymer containing the reactive functional group, which are included in the resin layer.

2. The film of claim 1, wherein the reactive functional group includes at least one selected from the group consisting of a carboxyl group, an amide group, an amino group, an epoxy group, a hydroxyl group, an acid anhydride group, an isocyanate group, a sulfonic acid group, an aziridine group, an amine group, a urea group, a phosphoric acid group, a cyano group, a cyanate group, an imidazole group, an oxazoline group, and an imine group.

3. The film of claim 1, wherein the acrylic polymer containing the reactive functional group is a copolymer of at least one selected from the group consisting of (meth)acrylate, alkyl (meth)acrylate, and isobornyl (meth)acrylate and at least one monomer containing a reactive functional group.

4. The film of claim 3, wherein the alkyl (meth)acrylate includes at least one selected from the group consisting of methyl (meth)acrylate, ethyl (meth)acrylate, propyl (meth)acrylate, n-butyl (meth)acrylate, s-butyl (meth)acrylate, t-butyl (meth)acrylate, isobutyl (meth)acrylate, hexyl (meth)acrylate, 2-ethylhexyl (meth)acrylate, n-octyl (meth)acrylate, isooctyl (meth)acrylate, n-nonyl (meth)acrylate, isononyl (meth)acrylate, n-decyl (meth)acrylate, isodecyl (meth)acrylate, n-dodecyl (meth)acrylate, n-tridecyl (meth)acrylate, and n-tetradecyl (meth)acrylate.

5. The film of claim 3, wherein the monomer containing the reactive functional group includes at least one selected from the group consisting of a carboxyl group-containing monomer, an amide group-containing monomer, an amino group-containing monomer, an epoxy group-containing monomer, a hydroxyl group-containing monomer, an acid anhydride group-containing monomer, an isocyanate group-containing monomer, a sulfonic acid group-containing monomer, an aziridine group-containing monomer, an amine group-containing monomer, a urea group-containing monomer, a phosphoric acid group-containing monomer, a cyano group-containing monomer, a cyanate group-containing monomer, an imidazole group-containing monomer, an oxazoline group-containing monomer, and an imine group-containing monomer.

6. The film of claim 3, wherein the monomer containing the reactive functional group includes a carboxyl group-containing monomer, an epoxy group-containing monomer, or an oxazoline group-containing monomer.

7. The film of claim 3, wherein the monomer containing the reactive functional group includes at least one selected from the group consisting of glycidyl (meth)acrylate, glycidyl alkyl (meth)acrylate, (meth)acrylic acid, isocyanato alkyl (meth)acrylate, (meth)acrylonitrile, cyclohexyl maleimide, hydroxy alkyl (meth)acrylate, maleic anhydride, p-toluene sulfonic acid, phosphoric acid, (meth)acrylamide, aminoalkyl (meth)acrylate, vinyl imidazole, and 2-isopropenyl-2-oxazoline.

8. The film of claim 3, wherein the acrylic polymer containing the reactive functional group further includes a polymerizable monomer.

9. The film of claim 8, wherein the polymerizable monomer includes styrene, chlorostyrene, chloromethyl styrene, or methyl styrene.

10. The film of claim 1, wherein the fluorine-based polymer includes a homopolymer, a copolymer, or a mixture thereof, which includes, in a polymerized form, at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD), and perfluoro-2-methylene-4-methyl-1,3-dioxolane (PMD).

11. The film of claim 1, wherein the fluorine-based polymer includes a homopolymer or copolymer containing vinyl fluoride (VF) in a polymerized form; a homopolymer or copolymer containing vinylidene fluoride (VDF) in a polymerized form; or a mixture thereof.

12. The film of claim 1, wherein the fluorine-based polymer includes a copolymer of vinylidene fluoride (VDF) or vinyl fluoride (VF) and at least one comonomer selected from the group consisting of tetrafluoroethylene (TFE), hexafluoropropylene (HFP), chlorotrifluoroethylene (CTFE), trifluoroethylene, hexafluoroisobutylene, perfluoro-butylethylene, PMVE, PEVE, PPVE, PHVE, PDD, and PMD; or mixture thereof.

13. The film of claim 12, wherein the comonomer is contained at a content of 0.5 to 50% by weight.

14. The film of claim 1, wherein the fluorine-based polymer has a weight-average molecular weight (MW) of 50,000 to 1,000,000.

15. The film of claim 1, wherein the fluorine-based polymer has a melting point of 80° C. to 175° C.

16. The film of claim 1, wherein the resin layer including the fluorine-based polymer and the acrylic polymer containing the reactive functional group contains 50% or less by weight of the acrylic polymer containing the reactive functional group.

17. The film of claim 1, wherein the substrate is aluminum (Al), iron (Fe); or a single sheet, a stacked sheet, or a co-extrusion of polyethylene terephthalate (PET), polyethylene naphthalate (PEN), or polybutylene terephthalate (PBT).

18. The film of claim 1, wherein at least one surface of the substrate is treated with at least one selected from the group consisting of plasma, corona, primer, a coupling agent, and heat.

19. The film of claim 1, wherein the substrate has a thickness of 50 μm to 500 μm.

20. The film of claim 1, wherein the resin layer including the fluorine-based polymer and the acrylic polymer containing the reactive functional group has a thickness of approximately 3 μm to 50 μm.

21. The film of claim 1, wherein the resin layer including the fluorine-based polymer and the acrylic polymer containing the reactive functional group further includes a pigment, a filler, an ultraviolet (UV) stabilizer, a thermal stabilizer, or barrier particles.

22. The film of claim 1, wherein the resin layer including the fluorine-based polymer and the acrylic polymer containing the reactive functional group is a coating layer formed by coating a resin composition.

23. A back sheet for a photovoltaic cell, comprising:
a substrate; and
a resin layer disposed on the substrate and including a fluorine-based polymer and an acrylic polymer containing a reactive functional group,
wherein an equivalent weight of the reactive functional group with respect to a mixture of the fluorine-based polymer and the acrylic polymer of the resin layer is 2,000 to 20,000,
wherein the acrylic polymer has a weight-average molecular weight of a hundred thousand to five million, and
wherein the acrylic polymer is contained at a content of 2 to 30% by weight in the mixture of the fluorine-based polymer and the acrylic polymer containing the reactive functional group, which are included in the resin layer.

24. A method of manufacturing a multilayered film, comprising forming a resin layer including a fluorine-based polymer and an acrylic polymer containing a reactive functional group on a substrate,
wherein an equivalent weight of the reactive functional group with respect to a mixture of the fluorine-based polymer and the acrylic polymer of the resin layer is 2,000 to 20,000,
wherein the acrylic polymer has a weight-average molecular weight of a hundred thousand to five million, and
wherein the acrylic polymer is contained at a content of 2 to 30% by weight in the mixture of the fluorine-based polymer and the acrylic polymer containing the reactive functional group, which are included in the resin layer.

25. A method of manufacturing a multilayered film, comprising forming a resin layer including a fluorine-based polymer and an acrylic polymer containing a reactive functional group on a substrate,
wherein an equivalent weight of the reactive functional group with respect to a mixture of the fluorine-based polymer and the acrylic polymer of the resin layer is 2,000 to 20,000,
wherein forming the resin layer including the fluorine-based polymer and the acrylic polymer containing the reactive functional group comprises coating a resin composition including the fluorine-based polymer, the acrylic polymer containing the reactive functional group and a solvent having a boiling point of 200° C. or lower on the substrate, and
wherein the acrylic polymer is contained at a content of 2 to 30% by weight in the mixture of the fluorine-based polymer and the acrylic polymer containing the reactive functional group, which are included in the resin layer.

26. The method of claim 25, wherein the solvent having a boiling point of 200° C. or lower includes at least one selected from the group consisting of acetone, methylethyl ketone, dimethyl formamide, and dimethyl acetamide.

27. The method of claim 24, before forming the resin layer, further comprising performing a treatment process using at least one selected from the group consisting of plasma, corona, primer, a coupling agent, and heat on at least one surface of the substrate.

28. The method of claim 25, drying the coated layer is further performed after coating the resin composition.

29. The method of claim 28, wherein drying the coated layer is performed at a temperature of 200° C. or less for 30 seconds to 30 minutes.

30. A back sheet for a photovoltaic cell, comprising the multilayered film of claim 1.

31. A photovoltaic module comprising the back sheet for the photovoltaic cell of claim 23.

32. A photovoltaic module comprising the back sheet for the photovoltaic cell of claim 30.

* * * * *